(12) United States Patent
Higuchi et al.

(10) Patent No.: US 7,323,641 B2
(45) Date of Patent: Jan. 29, 2008

(54) WIRED CIRCUIT BOARD HOLDING SHEET AND PRODUCTION METHOD THEREOF

(75) Inventors: Naotaka Higuchi, Osaka (JP); Kenkichi Yagura, Osaka (JP)

(73) Assignee: Nitto Denko Corporation, Osaka (JP)

( * ) Notice: Subject to any disclaimer, the term of this patent is extended or adjusted under 35 U.S.C. 154(b) by 373 days.

(21) Appl. No.: 11/011,952

(22) Filed: Dec. 15, 2004

(65) Prior Publication Data
US 2005/0139055 A1    Jun. 30, 2005

(30) Foreign Application Priority Data
Dec. 15, 2003    (JP)    ............... 2003-416020

(51) Int. Cl.
*H05K 1/00*    (2006.01)

(52) U.S. Cl. ....................... 174/250; 428/43

(58) Field of Classification Search ............... 174/250; 428/33, 43
See application file for complete search history.

(56) References Cited

U.S. PATENT DOCUMENTS 5,546,275 A * 8/1996 Moutrie et al. ............. 361/707
5,773,764 A * 6/1998 von Vajna ................... 174/250
5,831,218 A * 11/1998 Hu et al. ..................... 174/250
6,235,991 B1 * 5/2001 Johnson ..................... 174/70 R
6,239,381 B1 * 5/2001 Kasai et al. ................. 174/252
6,844,504 B2 * 1/2005 Wang et al. ................. 174/255

FOREIGN PATENT DOCUMENTS

JP    2000-323812    11/2000

* cited by examiner

*Primary Examiner*—Ishwar (I. B.) Patel
(74) *Attorney, Agent, or Firm*—Jean C. Edwards, Esq.; Akerman Senterfitt

(57) ABSTRACT

A wired circuit board holding sheet that can permit easy judgment on whether a cutting notch formed has a predetermined depth, and a production method of the wired circuit board holding sheet that can produce the wired circuit board holding sheet simply and easily. In the wired circuit board holding sheet 1 comprising a sheet 2 holding therein a plurality of separable wired circuit boards 3, the respective wired circuit boards 3 are held in the sheet 2 via joints 4 to be cut, and cutting notches 6 to facilitate cutting of the joints 4 and marking notches 7 to indicate that the cutting notches 6 have a predetermined depth to cut the joints 4 are formed simultaneously in both front and back surfaces of the joints 4 by using punches having combination of a main punch portion 13 and a sub-punch portion 14.

11 Claims, 4 Drawing Sheets

(a)

(b)

WIRED CIRCUIT BOARD HOLDING SHEET AND PRODUCTION METHOD THEREOF

BACKGROUND OF THE INVENTION

1. Field of the Invention

The present invention relates to a wired circuit board holding sheet and to a production method thereof. More particularly, the present invention relates to a wired circuit board holding sheet which is in the form of a sheet in which a plurality of separable wired circuit boards are held and to a production method thereof.

2. Description of the Prior Art

A wired circuit board is usually produced in the manner that a plurality of wired circuit boards are formed in a single sheet and, then, are separated off after electronic components are mounted on the respective wired circuit boards.

In this wired circuit board holding sheet which is in the form of a sheet in which a plurality of separable wired circuit boards are held, the respective wired circuit boards are held in the sheet via joints. It is usual that the joints are indented from the both front and back sides thereof by punching to make V-shaped cutting notches so that the joints can be cut easily by folding.

However, when the cutting notches are formed by punching, variations in depths of the notches may result easily. If a cutting notch has an insufficient depth, the joint cannot be cut smoothly by folding. If the joint is tried to be cut by folding it forcibly, then a wired circuit board and an electronic component mounted thereon may be damaged.

For example, JP Laid-open (Unexamined) Patent Publication No. 2000-323812 proposes the method that the presence of break in the form of V-shaped cutting notches, along which the sheet is split into a plurality of wired circuit boards, is electrically detected to prevent incorrect mounting of the electric and electronic circuit components, so as to ensure the mounting of electric and electronic circuit components on their respective wired circuit boards.

However, the method of JP Laid-open (Unexamined) Patent Publication No. 2000-323812 of electrically detecting the presence of break in the form of a V-shaped cutting notch requires a conductive testing device, involving the disadvantages of cost increase and troublesome work for such a conduction test.

In addition, although the method of JP Laid-open (Unexamined) Patent Publication No. 2000-323812 can permit the detection of the presence of a V-shaped cutting notch, it cannot permit the judgment on whether the cutting notch has a predetermined depth. Due to this, this method still cannot solve the problems mentioned above, namely, the problem that if the cutting notch has an insufficient depth, the joint cannot be cut smoothly by folding and the problem that if the joint is tried to be cut by folding it forcibly, then a wired circuit board and an electronic component mounted thereon may be damaged.

SUMMARY OF THE INVENTION

It is an object of the invention to provide a wired circuit board holding sheet that can permit easy judgment on whether a cutting notch formed has an adequate depth and a production method of the wired circuit board holding sheet that can produce the wired circuit board holding sheet simply and easily.

The present invention provides a wired circuit board holding sheet comprising a sheet holding therein a plurality of separable wired circuit boards, wherein the respective wired circuit boards are held in the sheet via joints to be cut, and wherein cutting notches to facilitate cutting of the joints and marking notches to indicate that the cutting notches have a predetermined depth are formed in the joints.

In the wired circuit board holding sheet of the present invention, it is preferable that the wired circuit boards include reinforcing layers, the reinforcing layers being formed to be integral with the joints and the sheet.

The present invention covers a production method of a wired circuit board holding sheet comprising a sheet holding therein a plurality of separable wired circuit boards, the method comprising the process of preparing the wired circuit board holding sheet wherein the wired circuit boards are held in the sheet via joints to be cut, and the process of forming in the joints cutting notches to facilitate cutting of the joints and marking notches to indicate that the cutting notches have a predetermined depth simultaneously by using punches comprising combination of main punch portions used to form the cutting notches and sub-punch portions used to form the marking notches.

In the production method of the wired circuit board holding sheet of the present invention, it is preferable that a tip of the main punch portion of the punch and a tip of the sub-punch portion of the punch are arranged in parallel and at a spaced interval, the spaced interval being defined so that the tip of the sub-punch portion defines the marking notch in a surface of the joint when the tip of the main punch portion reaches to a predetermined depth to define the cutting notch from the surface of the joint with respect to a punching direction.

The wired circuit board holding sheet of the present invention can permit an operator to judge on whether the cutting notch has a predetermined depth by simply making a visual check of the presence of the marking notch. In other words, one can easily know from the presence of the marking notch that the cutting notch has already reached to a predetermined depth. Also, one can easily know from the absence of the marking notch that the cutting notch has not yet reached to the predetermined depth. Hence, the joints can be cut properly to prevent the damage of the wired circuit board caused by an improper cutting and the resulting damage of the electronic components mounted thereon.

When the reinforcing layers of the wired circuit boards is integrally combined with the joints and sheet, there can be provided the advantage of providing reinforcement for the wired circuit boards, while providing further simplification in construction.

Also, the production method of the wired circuit board holding sheet of the present invention can permit the simultaneous forming of the cutting notches to facilitate cutting of the joints and the marking notches to indicate that the cutting notches have a predetermined depth in the joints by using the punches each having combination of the main punch portion to form the cutting notch and the sub-punch portion to form the mark notch. Thus, in this production method of the wired circuit board holding sheet, the cutting notches and the marking notches can be formed easily, rapidly, and reliably only in a single process, thus achieving the efficient production of the wired circuit board holding sheet.

In the production method of the wired circuit board holding sheet of the present invention, a tip of the main punch portion of the punch and a tip of the sub-punch portion of the punch are arranged in parallel and at a spaced interval, the spaced interval being defined so that the tip of the sub-punch portion defines the marking notch in a surface of the joint when the tip of the main punch portion reaches to a predetermined depth to define the cutting notch from the surface of the joint with respect to a punching direction. This configuration of the punch can provide the result that when the tip of the main punch portion punched in reaches to a predetermined depth from a surface of the joint in the punching, the marking notch is defined in the surface of the joint by the tip of the sub-punch portion. On the other hand, when the tip of the main punch portion does not reach to the predetermined depth from the surface of the joint in the punching, the marking notch is not defined in the surface of the joint by the tip of the sub-punch portion. Thus, it is only when the cutting of the cutting notches can reach to a predetermined depth that the marking notches can be definitely formed.

(b) illustrates the process of forming insulating base layers on the sheet;

(c) illustrates the process of forming conductive patterns on the respective insulating base layers;

(d) illustrates the process of forming insulating cover layers on the respective insulating base layers including the conductive patterns;

(e) illustrates the process of stamping the sheet to form an aperture surrounding each of wired circuit boards, and a joint; and (f) illustrates the process of forming a cutting notch and a marking notch in each joint by punching.

Figure 3:
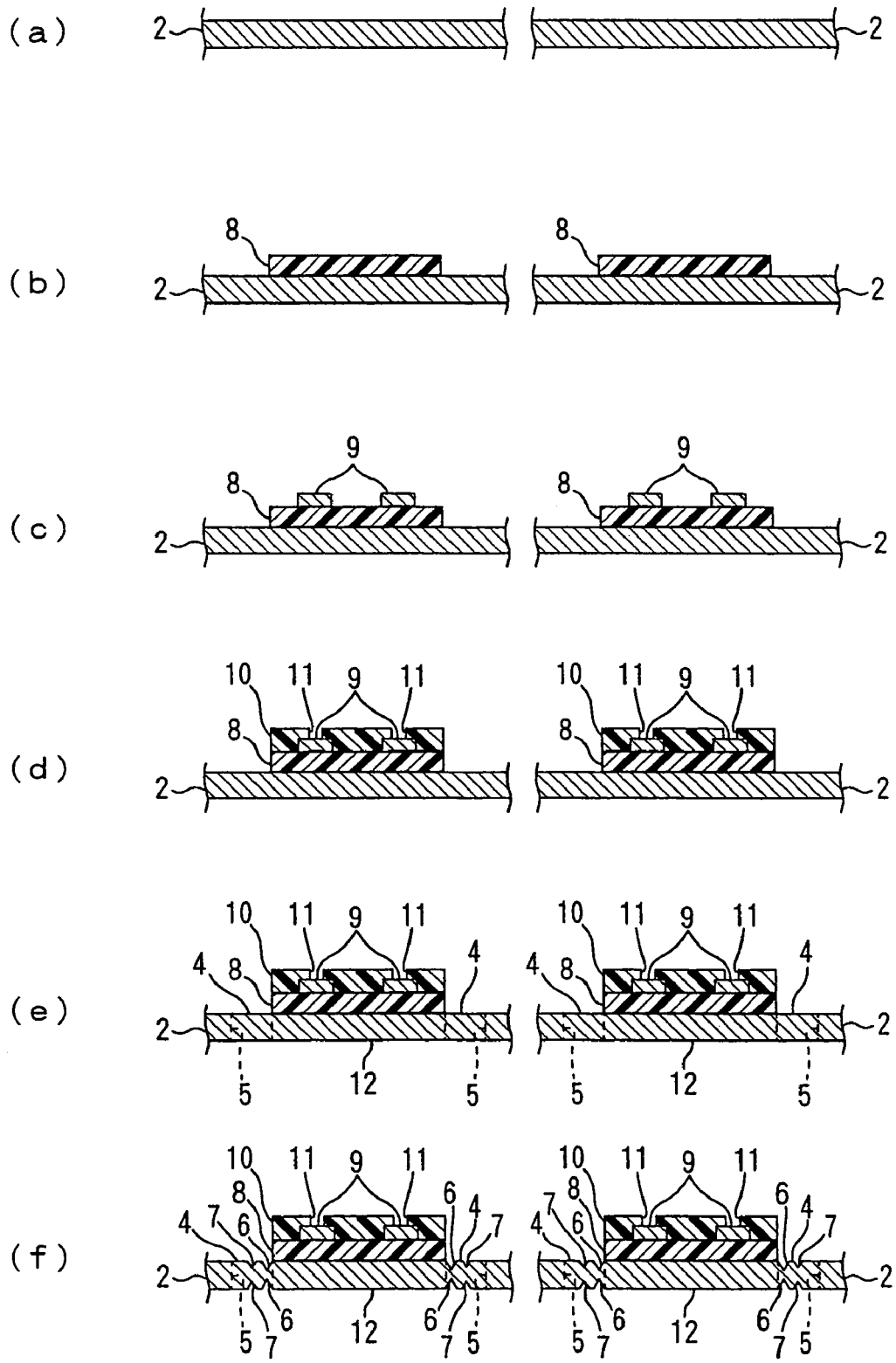
FIG. 3 is a process drawing illustrating a production method of the wired circuit board holding sheet shown in FIG. 1, (a) illustrates the process of preparing a sheet.
Figure 4:
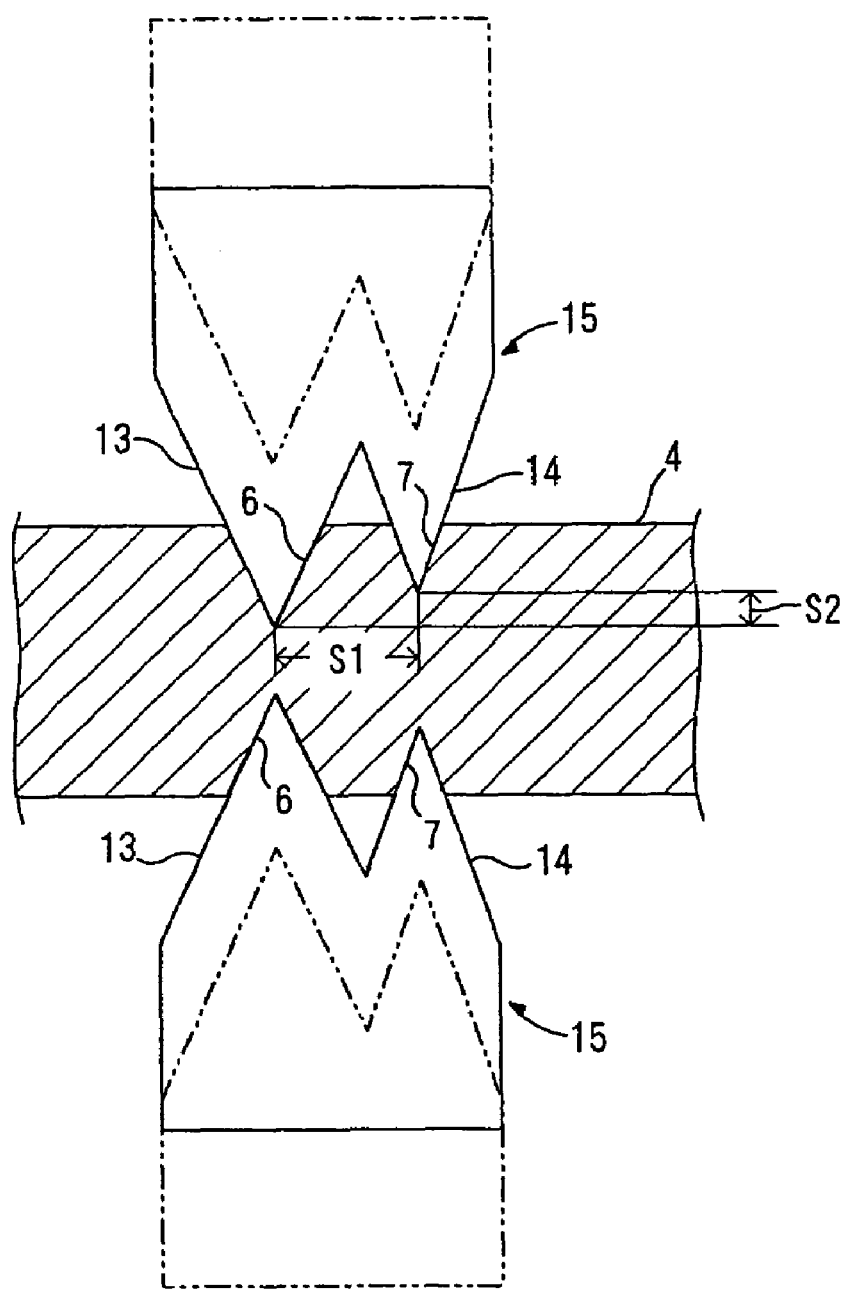

FIG. 4 is a process drawing illustrating in detail the process of FIG. 3(*f*) of forming a cutting notch and a marking notch in each joint by punching.

DETAILED DESCRIPTION OF THE PREFERRED EMBODIMENT

Figure 1:
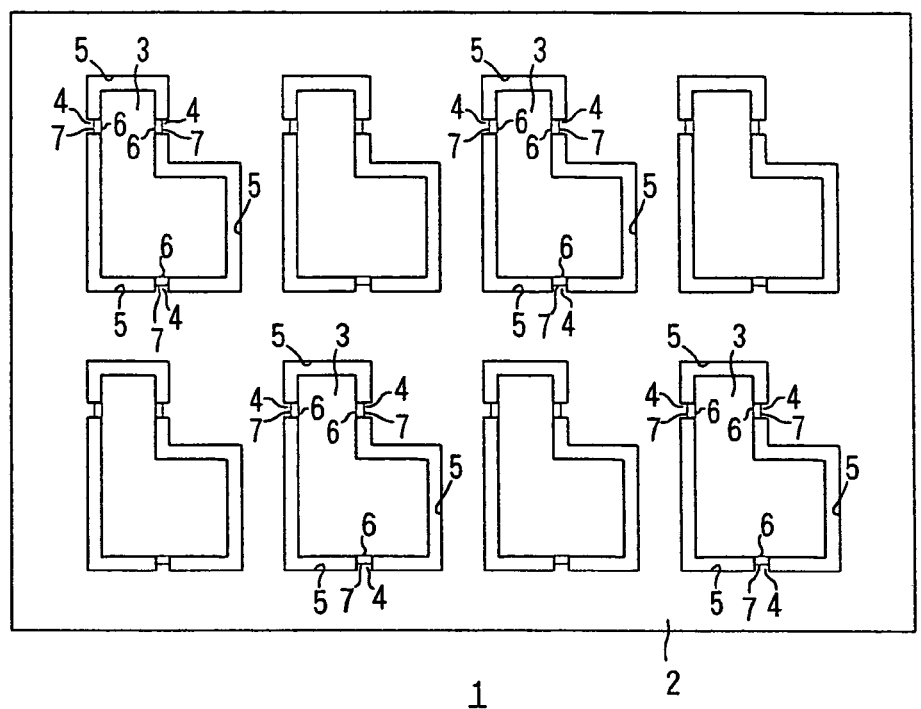
FIG. 1 is a plan view showing an embodiment of a wired circuit board holding sheet of the present invention.
Figure 2:
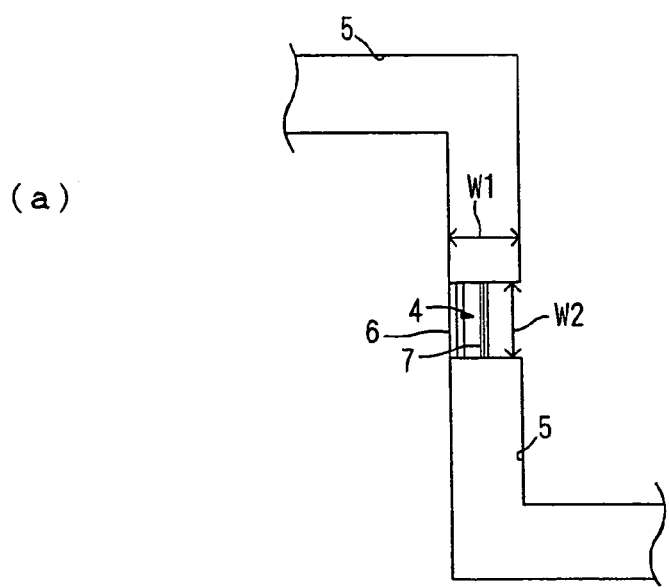
FIG. 2 is an enlarged view of a principal part of the wired circuit board holding sheet shown in FIG. 1, (a) showing a plan view of the same and (b) showing a cross sectional view of the same.
Figure 2:
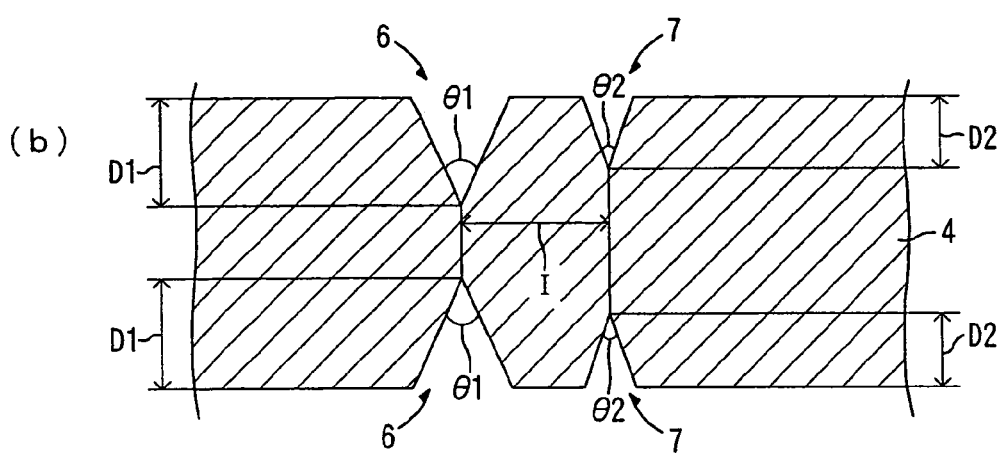

FIG. 1 is a plan view showing an embodiment of a wired circuit board holding sheet of the present invention, and FIG. 2 is an enlarged view of a principal part of the same.

Referring to FIG. 1, the wired circuit board holding sheet 1 comprises a flat sheet 2, and a plurality of separable wired circuit boards 3 held in the sheet 2.

The wired circuit boards 3 are arranged on the sheet 2 in the aligned state of being spaced apart from each other at a predetermined distance and are held in the sheet 2 via joints 4 able to be cut.

To be more specific, the wired circuit boards 3 are arranged in the sheet 2, and apertures 5 are formed between circumferential portions of the wired circuit boards 3 and circumferential portions of the sheet 2 extending around the respective wired circuit boards 3 to surround the respective wired circuit boards 3. A width W1 of the aperture 5 (FIG. 2(*a*)) is usually set to be in the range of 0.5 mm to 2 mm.

Also, a plurality of joints 4 (three joints) are formed in the sheet 2 to pass across the aperture 5. Each joint 4 is formed to extend from the circumferential portion of the sheet 2 to the circumferential portion of the wired circuit board 3, passing through the aperture 5 in a direction orthogonal to a longitudinal dimension of the aperture 5. A width W2 of the joint 4 (FIG. 2(*a*)) is usually set to be in the range of 0.5 mm to 2 mm. The locations and number of joints 4 can be determined properly, depending on the size and shape of the wired circuit board 3.

Also, a cutting notch 6 to facilitate the cutting of the joint 4 and a marking notch 7 to indicate that the cutting notch 6 has a depth enough to cut the joint 4 are formed in each side of the joint 4.

The cutting notch 6 and the marking notch 7 are formed over the entire width of the joint 4 to extend along a widthwise direction orthogonal to the longitudinal direction of the joint 4 extending from the circumferential portion of the sheet 2 to the circumferential portion of the wired circuit board 3. The cutting notch 6 and the marking notch 7 are arranged in parallel and spaced apart from each other at a predetermined distance I (FIG. 2(*b*)) (usually in the range of 0.5-2 mm, or preferably in the range of 0.7-1.5 mm).

The cutting notch 6 is formed at a lengthwise end portion of the joint 4, namely, at the circumferential portion of the wired circuit board 3 or at the circumferential portion of the sheet 2 where the cutting notch 6 is subjected to stress concentration when cut off by folding. Preferably, the cutting notches 6 are formed at the circumferential portion of the wired circuit board 3 side from both front and back sides of the joint 4 to correspond in position to each other and extend along the circumferential portion of the wired circuit board 3 so that no fragment of the joint 4 is left in the joint 4. The cutting notches 6 are each formed in the form of a V-shaped notch having an adequate depth to be cut off by a main punch portion 13 of a punch 15 (FIG. 4) as mentioned later. A ratio of a depth D1(FIG. 2(*b*)) of the cutting notch 6 to a thickness of the joint 4 is usually 20% or more, or preferably in the range of 25-30%. More specifically, the depth D 1 of the cutting notch 6 is set to be 0.1 mm or more, or preferably in the range of 0.1-0.3 mm. Also, an angle θ1 of the deepest portion of the V-shaped cutting notch 6 (FIG. 2*b*) is usually set to be in the range of 40-60°.

The marking notches 7 are each formed at a longitudinal portion of the joint 4, more specifically, at a lengthwise center portion of the joint 4 and are formed from both front and back sides of the joint 4 to correspond in position to each other. The marking notches 7 are each formed in the form of a V-shaped notch having an adequate depth to be checked visually by a sub-punch portion 14 of the punch 15 (FIG. 4) as mentioned later. A depth D2(FIG. 2(*b*)) of the marking notch 7 is smaller than the depth D1 of the cutting notch 6 and a ratio of the depth D2 of the marking notch 7 to the depth D1 of the cutting notch 6 is usually 30% or less, or preferably in the range of 10-20%. More specifically, the depth D2 of the marking notch 7 is set to be 0.05 mm or less, or preferably in the range of 0.01-0.05 mm (Preferably, the difference between the depth D1 of the cutting notch 6 and the depth D2 of the marking notch 7 with respect to a cutting direction is in the range of 0.08-0.1 mm). Also, an angle θ2 of the deepest portion of the V-shaped marking notch 7 (FIG. 2*b*) is usually set to be in the range of 40-60°.

Next, the method of producing the wired circuit board holding sheet 1 will be described with reference to FIG. 3.

In this method, the sheet 2 is prepared, first, as shown in FIG. 3(*a*). The sheet 2 is formed of a thin metal sheet of e.g. aluminum, stainless steel, 42-alloy and the like. The sheet 2 usually has a thickness of 0.1-1 mm, or preferably 0.2-0.6 mm.

Then, a plurality of wired circuit boards 3 are arranged on the sheet 2 in an aligned state that they are spaced apart from each other at a predetermined distance, as shown in FIG. 3(b) to FIG. 3(d). No particular limitation is imposed on the formation of the wired circuit boards 3. For example, the wired circuit boards 3 can be formed in the following manner.

First, insulating base layers 8 are formed in a predetermined form (a generally L-shape in FIG. 1) and arranged on the sheet 2 in the aligned state of being spaced apart from each other at a predetermined distance, as shown in FIG. 3(b). No particular limitation is imposed on the formation of the insulating base layers 8. For example, liquid solution of photosensitive resin (e.g. liquid solution of photosensitive polyamic acid resin) is coated over a surface of the sheet 2 and then the coating is exposed to light and developed to form a coating of a predetermined pattern of the aligned state in which the insulating base layers 8 are spaced apart from each other at a predetermined distance. Thereafter, the coating is dried and then cured. The insulating base layers 8 of e.g. a synthetic resin film formed of e.g. polyimide resin are formed in the manner described above. Each insulating base layer 8 usually has a thickness of 12-25 µm. Alternatively, the insulating base layers 8 may be formed by adhesively bonding a resin film with a predetermined pattern to the sheet 2 via an adhesive layer.

Then, a conductive pattern 9 is formed on each insulating base layer 8, as shown in FIG. 3(c). The conductive pattern 9 is formed of conductive material such as copper, nickel, gold, solder, or alloys thereof. Preferably, the conductive pattern 9 is formed of copper. No particular limitation is imposed on the formation of the conductive pattern 9. The conductive pattern 9 is formed in the form of a predetermined wiring circuit pattern on the each insulating base layer 8 by a known patterning process, such as a subtractive process and an additive process.

In the subtractive process, for example a conductor layer is laminated on the entire surface of the each insulating base layer 8 using, if necessary, an adhesive layer, first. Then, an etching resist having the same pattern as the wiring circuit pattern is formed on the conductor layer. Then, with the etching resist as a resist, the conductor layer is etched to form the conductive pattern 9. Thereafter, the etching resist is removed.

In the additive process, a seed film formed of conductive material is formed on the each insulating base layer 8 by e.g. a sputtering deposition method, first. Then, after a plating resist having a reversal pattern to the wiring circuit pattern is formed on the seed film, the conductive pattern 9 is formed by electrolysis plating on a surface of the seed film exposed from the plating resist. Thereafter, the plating resist and the part of the seed film on which the plating resist was laminated are removed. The conductive pattern 9 usually has a thickness of 10-35 µm.

Thereafter, an insulating cover layer 10 is formed on the each insulating base layer 8 including the conductive pattern 9, as shown in FIG. 3(d). No particular limitation is imposed on the formation of the insulating cover layers 10. For example, liquid solution of photosensitive resin (e.g. liquid solution of photosensitive polyamic acid resin) is coated over a surface of the insulating base layer 8 including the conductive pattern 9 and then the coating is exposed to light and developed to form a coating of a predetermined pattern defining an opening to which a terminal portion 11 opens. Thereafter, the coating is dried and then cured. The insulating cover layers 10 of e.g. a synthetic resin film formed of e.g. polyimide resin are formed in the manner described above. Each insulating cover layer 10 usually has a thickness of 12-25 µm. Alternatively, the insulating cover layers 10 may be formed by adhesively bonding a resin film with a predetermined pattern to the sheet 2 via an adhesive layer.

Then, the sheet 2 is punched out to form the apertures 5 surrounding the respective wired circuit boards 3, and the joints 4, as shown in FIG. 3(e). No particular limitation is imposed on the punching. For example, the sheet 2 is put on a die and then is stamped with a punch having a corresponding form to the apertures 5.

After the processes mentioned above, the area of the sheet 2 where the respective wired circuit boards 3 are formed serves as reinforcing layers 12 for the respective wired circuit boards 3. The reinforcing layers 12 are formed to be integral with the joints 4 and the sheet 2. The wired circuit board holding sheet 1 wherein the wired circuit boards 3 are held via the separable joints 4, respectively, is prepared in the manner mentioned above.

The reinforcing layers 12 of the wired circuit boards 3 integrally combined with the joints 4 and sheet 2 can provide the advantage of providing reinforcement for the wired circuit boards 3, while providing simplification in construction.

Then, the cutting notches 6 and the marking notches 7 are formed in both front and back sides of the joints 4 by punching, as shown in FIG. 3(f).

In the punching process, the cutting notches 6 and the marking notches 7 are formed at a stroke for example using punches 15 each having combination of a main punch portion 13 and a sub-punch portion 14, as shown in FIG. 4. Specifically, the cutting notches 6 are formed by the main punch portions 13 of the punches 15 and the marking notches 7 are formed by the sub-punch portions 14 of the punches 15.

To be more specific, each of the punches 15 has the main punch portion 13 having a generally inverted triangular cross section and the sub-punch portion 14 having a generally inverted triangular cross section. The main punch portion 13 and the sub-punch portion 14 are arranged in parallel so that their tips are arranged in parallel at a spaced interval S1 of 0.5-2 mm. Also, the each punch 15 has the configuration that a spaced interval S2 with respect to a punching direction (a stamping direction) is defined between the tip of the sub-punch portion 14 and the tip of the main punch portion 13 to make the tip of the sub-punch portion 14 lower than the tip of the main punch portion 13 by e.g. 0.08-1 mm so that the tip of the sub-punch portion 14 cannot define the marking notch 7 of an adequate depth to be checked visually in the front surface (or the back surface) of the joint 4 until the tip of the main punch portion 13 reaches to an adequate depth to define the cutting notch 6 able to cut the joint 4 from the front surface (or the back surface) of the joint 4.

These punches 15 are arranged on the front side and the back side of the joint 4 to confront each other. The punches 15 are pressed to the front and back surfaces of the joint 4, respectively, so that at the same time that the cutting notches 6 are stamped by the main punch portions 13, the marking notches 7 are stamped by the sub-punch portions 14 to form the cutting notches 6 and the marking notches 7 on the both front and back sides of the joints 4 simultaneously.

This production method of the wired circuit board holding sheet 1 can permit the simultaneous forming of the cutting notches 6 and the marking notches 7 in the joints 4 by using the punches 15 each having combination of the main punch portion 13 and the sub-punch portion 14. Thus, in this production method, the cutting notches 6 and the marking notches 7 can be formed easily, rapidly, and reliably only in a single process, thus achieving the efficient production of the wired circuit board holding sheet 1.

Besides, the each punch 15 has the configuration that the tip of the main punch portion 13 and the tip of the sub-punch portion 14 are arranged in parallel and are arranged at such a spaced interval with respect to a punching direction that the tip of the sub-punch portion 14 cannot define the marking notch 7 to be checked visually in the front surface (or the back surface) of the joint 4 until the tip of the main punch portion 13 reaches to an adequate depth to define the cutting notch 6 able to cut the joint 4 from the front surface (or the back surface) of the joint 4. This configuration of the punch 15 can provide the result that when the tip of the main punch portion 13 reaches to an adequate depth to define the cutting notch 6 able to cut the joint 4 from the front surface (or the back surface) of the joint 4 in the punching process, the marking notch 7 to be checked visually is defined in the front surface (or the back surface) of the joint 4 by the tip of the sub-punch portion 14. On the other hand, when the tip of the main punch portion 13 does not reach to an adequate depth to cut the joint 4 from the front surface (or the back surface) of the joint 4 in the punching process, the marking notch 7 to be checked visually is not yet defined in the front surface (or the back surface) of the joint 4 by the tip of the sub-punch portion 14. Thus, it is only when the cutting of the cutting notches 6 can reach to an adequate depth to cut the joint 4 from the front surface (or the back surface) of the joint 4 that the marking notches 7 for the visual check can be definitely formed.

Thus, the wired circuit board holding sheet 1 produced by this method can permit an operator to judge on whether the cutting notch 6 has an adequate depth to cut the joint 4 by simply making a visual check of the presence of the marking notch 7. In other words, one can easily know from the presence of the marking notch 7 that the cutting notch 6 has already reached to an adequate depth to cut the joint 4. Also, one can easily know from the absence of the marking notch 6 that the cutting notch 6 has not yet reached to the adequate depth to cut the joint 4. Hence, the joints 4 can be cut properly to prevent the damage of the wired circuit board 3 caused by an improper cutting and the resulting damage of the electronic components mounted thereon.

Although the embodiment wherein the process of punching the sheet 2 shown in FIG. 3(e) and the process of forming the cutting notches 6 and the marking notches 7 shown in FIG. 3(f) are carried out in sequence has been described above, the both processes can be carried out simultaneously. In this case, the punch 15 used for forming the cutting notches 6 and the marking notches 7 is combined with the punch used for punching out the apertures 5, to make a combined punch, so that the apertures 5, the joints 4, the cutting notches 6, and the marking notches 7 are formed simultaneously using the combined punch.

Although the method in which the insulating base layer 8, the conductive pattern 9, the insulating cover layer 10 are sequentially laminated on the sheet 2 has been described above, another method may be used wherein after a wired circuit board comprising the insulating base layer 8, the conductive pattern 9, and the insulating cover layer 10 is produced separately, the wired circuit board is adhesively bonded to the sheet 2 using an adhesive. In this variant, the wired circuit board may be previously punched out in a predetermined form and also, the joints 4, the cutting notches 6, and the marking notches 7 may be previously formed in the sheet 2 before adhesively bonded to the sheet 3.

EXAMPLE

While in the following, the present invention will be described in further detail with reference to Example, the present invention is not limited thereto.

Example 1

A sheet of a thin aluminum sheet having a thickness of 0.4 mm was prepared, first (Cf. FIG. 3(a)). Then, after liquid solution of photosensitive polyamic acid resin was coated over the entire surface of the sheet, the coated resin was exposed to light and developed and then dried and cured, whereby eight insulating base layers of polyimide resin having a thickness of 12 μm were formed on the single sheet in the aligned state of being spaced apart from each other at a predetermined distance (Cf. FIG. 3(b)).

Then, a thin chromium film and a thin copper film were laminated in sequence on each of the insulating base layers by the sputtering deposition process, to thereby form a seed film having a thickness of 150 nm. Thereafter, a plating resist having a reversal pattern to the wiring circuit pattern was formed by exposing a dry film photoresist to light and developing it. Then, the conductive pattern was formed on the seed film exposed from the plating resist by electrolysis copper plating. Thereafter, the plating resist and a portion of the seed film on which the plating resist had been laminated was removed by the chemical etching, to thereby form the conductive pattern having a thickness of 17 μm on the each insulating base layer (Cf. FIG. 3(c)).

Then, after liquid solution of photosensitive polyamic acid resin was coated over the insulating base layer including the conductive pattern, the coated resin was exposed to light and developed and then dried and cured, whereby insulating cover layers of polyimide resin having a thickness of 12 μm were formed in a predetermined pattern having an opening to which a terminal opened (Cf. FIG. 3(d)).

Then, the sheet was punched out so that the apertures surrounding the respective wired circuit boards and the joints were formed in the sheet (Cf. FIG. 3(e)). Ninety-six joints were arranged in the single sheet, in other words, twelve joints for each of the wired circuit boards were arranged. The width of the aperture was set to be 1.5 mm, and the width of the joint was set to be 1 mm.

Thereafter, the punches each having a main punch portion combined with a sub-punch portion were arranged to confront each other on both front and back sides of each joint. Then, the cutting notches and the marking notches were formed simultaneously in such a manner that the cutting notches were punched in by the main punch portions of the punches and the marking notches were punched in by the sub-punch portions of the punches (Cf. FIG. 3(f)).

The distance between the cutting notch and the marking notch was set at 0.8 mm. The V-shaped cutting notches were formed along the circumferential portions of the wired circuit boards in a depth of 0.15 mm and at an angle of 50°±10° at the deepest portion thereof. Also, the V-shaped marking notches were formed in lengthwise center portions of the joints in a depth of 0.05 mm and at an angle of 50°±10° at the deepest portion thereof.

When the visual check of the wired circuit board holding sheet thus obtained was made, it was found that the marking notches were formed in every joint. Then, the respective wired circuit boards could be smoothly folded along the cutting notches to separate all the wired circuit boards from the sheet reliably.

While the illustrative embodiments of the present invention are provided in the above description, such is for illustrative purpose only and it is not to be construed restrictively. Modification and variation of the present invention that will be obvious to those skilled in the art is to be covered by the following claims.

The disclosure of Japanese patent application Serial No. 2003-416020, filed on Dec. 15, 2003, is incorporated herein by reference.

What is claimed is:

1. A wired circuit board assembly comprising:
   a sheet;
   a wired circuit board formed from the sheet;
   an aperture provided along a perimeter of the wired circuit board to separate the sheet and the wired circuit board;
   a joint provided in the aperture to mechanically couple the sheet and the wired circuit board;
   a cutting notch provided on a first surface of the joint, the cutting notch having a first depth;
   a marking notch provided on the first surface of the joint, the marking notch having a second depth that is less than the first depth,
   wherein the cutting notch facilitates cutting of the joints and the marking notch indicates that the cutting notch has a predetermined depth.

2. The wired circuit board assembly according to claim 1, wherein the wired circuit board includes a reinforcing layer that is formed from the sheet and wherein the joint couples the reinforcing sheet to the sheet.

3. The wired circuit board assembly according to claim 1, wherein the cutting notch and the marking notch are formed parallel to each other on the first surface.

4. The wired circuit board assembly according to claim 1, further comprising:
   a second cutting notch provided on a second surface of the joint, wherein the second surface of the joint is opposite to the first surface of the joint; and
   a second marking notch provided on a second surface of the joint, wherein the second surface of the joint is opposite to the first surface of the joint.

5. The wired circuit board assembly according to claim 4, wherein the cutting notch and the second cutting notch are aligned.

6. The wired circuit board assembly according to claim 4, wherein the marking notches and the second marking notch are aligned.

7. The wired circuit board assembly according to claim 1, wherein the cutting notch and the marking notch are continuously formed along a widthwise direction of the joint, from a first edge of the joint to a second edge of the joint.

8. The wired circuit board assembly according to claim 1, wherein the cutting notch and the marking notch are V-shaped.

9. The wired circuit board assembly according to claim 1, wherein a ratio of the first depth to a thickness of the joint is at least 20%.

10. The wired circuit board assembly according to claim 1, wherein a ratio of the second depth to a thickness of the joint is less than 30%.

11. The wired circuit board assembly according to claim 1, wherein the cutting notch is provided on the first surface of the joint at a location proximate to the wired circuit board; and
   wherein the marking notch is provided on the first surface of the joint at a location proximate to the sheet.

* * * * *